United States Patent [19]

Kuzuya et al.

[11] Patent Number: 5,126,783
[45] Date of Patent: Jun. 30, 1992

[54] IMAGE RECORDING APPARATUS HAVING SECONDARY EXPOSURE UNIT

[75] Inventors: Susumu Kuzuya, Gifu; Takakuni Sonoda, Toyoake; Tomoaki Hattori, Nagoya; Kazunori Tanabe, Nagoya; Toshio Sakai, Nagoya; Hiroshi Taira, Ichinomiya; Hidenori Hisada, Tokoname; Makoto Suzuki, Nagoya, all of Japan

[73] Assignee: Brother Kogyo Kabushiki Kaisha, Nagoya, Japan

[21] Appl. No.: 611,837

[22] Filed: Nov. 13, 1990

[30] Foreign Application Priority Data

Jan. 10, 1990 [JP] Japan ............................ 2-3780

[51] Int. Cl.⁵ .............................. G03B 27/32
[52] U.S. Cl. ........................ 355/27; 355/43; 355/75
[58] Field of Search ............ 355/27, 28, 32, 19, 355/43, 75; 430/138; 346/105, 106

[56] References Cited

U.S. PATENT DOCUMENTS

| 4,884,082 | 11/1989 | Sonoda et al. | 346/105 |
| 4,908,653 | 3/1990 | Sago et al. | 355/27 |
| 4,984,012 | 1/1991 | Sawada et al. | 355/27 |

FOREIGN PATENT DOCUMENTS

| 62-143044 | 6/1977 | Japan . |
| 58-88739 | 7/1983 | Japan . |
| 63-198035 | 3/1988 | Japan . |
| 63-200835 | 4/1988 | Japan . |
| 63-268650 | 11/1988 | Japan . |

Primary Examiner—L. T. Hix
Assistant Examiner—Khanh Dang
Attorney, Agent, or Firm—Oliff & Berridge

[57] ABSTRACT

An image forming apparatus for forming an image on a photosensitive recording medium by exposing the photosensitive recording medium to light by way of a mask member which is placed on an exposure station. The apparatus comprises a first transport device which transports the mask member through the exposure station and a second transport device which transports the photosensitive recording medium through the exposure station. A first exposure unit irradiates light upon the photosensitive record medium by way of said mask member at the exposure station to record an image formed on the mask member on the photosensitive recording medium. Alternatively, when a mask member is not used, a second exposure unit directs light through an auxiliary member having a light-passing image thereon to project and record the light-passing image onto the photosensitive recording medium.

6 Claims, 3 Drawing Sheets

IMAGE RECORDING APPARATUS HAVING SECONDARY EXPOSURE UNIT

BACKGROUND OF THE INVENTION

1. Field of the Invention

The present invention relates to an image recording apparatus for exposing a photosensitive recording medium to light using a mask member, and more particularly to an image recording apparatus which can also expose a photosensitive recording medium to light by means of an image bearing member, other than a mask member, such as a slide film.

2. Description of Prior Art

An image recording apparatus which uses a mask member has been conventionally proposed and is disclosed in U.S. Pat. No. 4,884,082. As shown in FIG. 3, the image recording apparatus disclosed in U.S. Pat. No. 4,884,082 is constituted from a laser printer section B and a color printer section C. In the laser printer section B, a toner image is formed on a sheet fed from a sheet unit 300 to produce a mask member. The mask member thus produced is introduced to an exposure position between an exposure unit 270 and a photosensitive pressure-sensitive microcapsule sheet 900. Then, an exposure operation is performed by the exposure unit 270 so that a latent image corresponding to the toner image formed on the mask member is formed on the photosensitive pressure-sensitive microcapsule sheet 900. After exposure processing for a mask member is completed it is fed from the exposure position and stored in a feed passage 220a. A similar operation is performed with a total of three mask members (individually having thereon toner images corresponding to the three primary colors). Then the portion of the photosensitive pressure-sensitive microcapsule sheet 900 on which the latent image is formed and a developer sheet 220 are pressurized by a pressure developing unit 230 to record a color image on the developer sheet 220.

Since the mask members, after the first use, are stored in the fed passage 22a which generally makes a loop, additional color images can be produced by successively introducing the mask members to the exposure position.

With the conventional apparatus described above, however, since the feed passage for a mask member is located above the exposure position and the exposure unit is disposed on the inner side of the feed passage, the exposure can only be performed with close contact between the mask member and the microcapsule sheet 900 thereby producing an exposure of an equal magnification. Accordingly, there is a problem that a color image cannot be obtained by enlarging an exposure from a slide film, negative or a like transparency.

SUMMARY OF THE INVENTION

Accordingly, it is an object of the present invention to provide an image recording apparatus which can record an image on a photosensitive recording medium using a mask member and can also effect enlarging recording of an image which is formed on a medium other than a mask member, such as a slide film.

According to the present invention, there is provided an image recording apparatus wherein light is irradiated upon a photosensitive recording medium on which a light transmitting member is placed to record an image on the photosensitive recording medium, comprising: an exposure station; first transport means for transporting the photosensitive recording medium past the exposure station; second transport means for transporting a mask member past the exposure station; a first exposure unit for irradiating light upon the photosensitive record medium by way of the mask member at the exposure station to record an image formed on the mask member onto the photosensitive recording medium; and a second exposure unit for irradiating light by way of a medium having a light passing image thereon to project the light passing image onto the photosensitive recording medium to record the light passing image on the photosensitive recording medium.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENT

Hereinafter, an embodiment of the present invention will be described with reference to the drawings.

Figure 1:
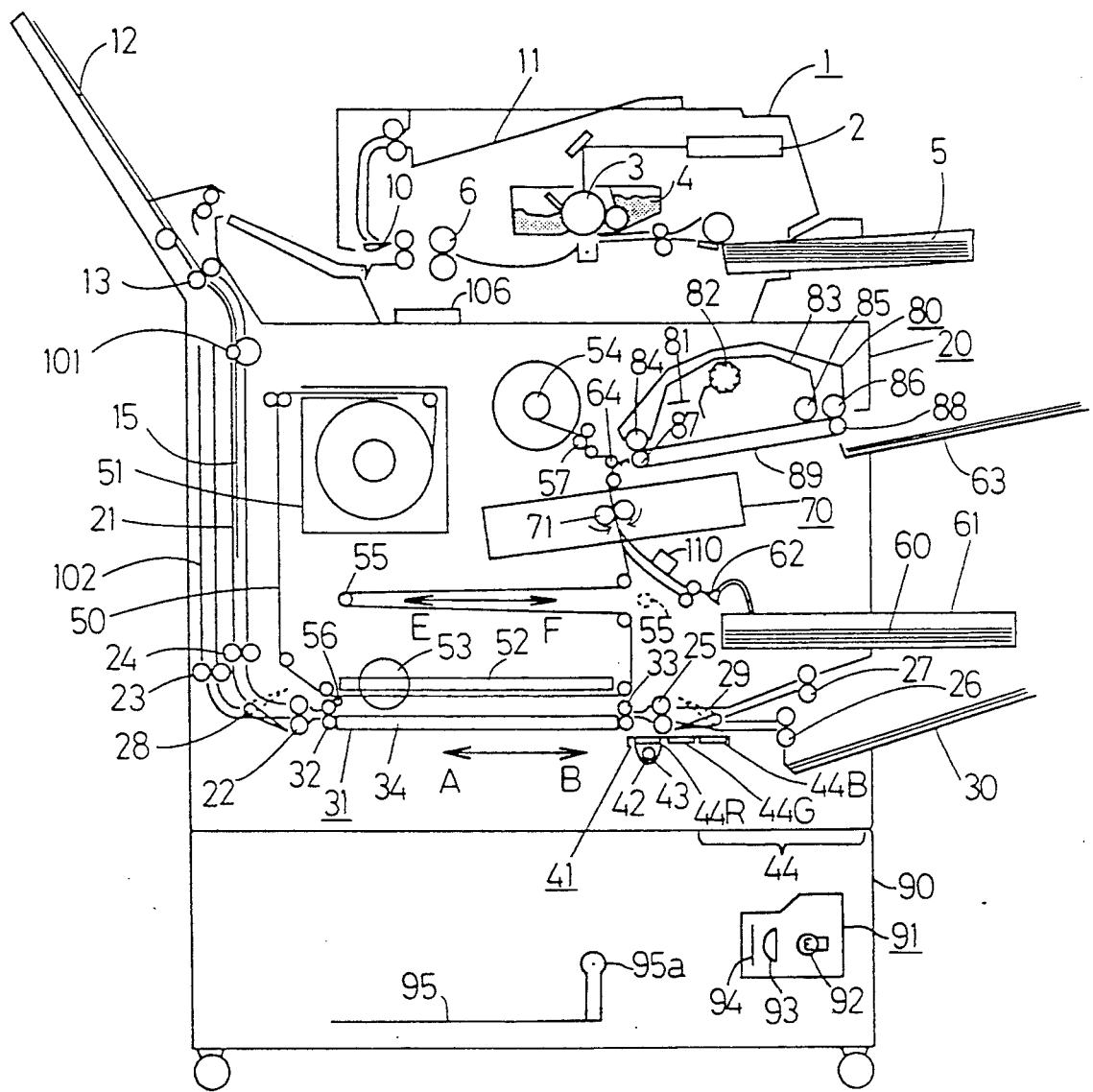
FIG. 1 shows an image recording apparatus according to an embodiment of the present invention.

FIG. 1 is a sectional view showing a monochromatic laser printer 1 and a color image recording apparatus 20 arranged in a coupled condition. The monochromatic laser printer 1 is placed on top of the color image recording apparatus 20.

In the laser printer 1, a laser beam is directed at an electrically charged photosensitive member or drum 3 by means of a polygon scanner 2 to form an electrostatic latent image on the photosensitive drum 3. The electrostatic latent image formed on the photosensitive drum 3 is then developed by a developing unit 4. A toner image formed by such development is transferred to a plain paper sheet or an overhead projector (transparent) sheet supplied from a sheet cassette 5. The toner image is then fixed to the sheet by a fixing unit 6. Normally, the monochromatic laser printer 1 records data transmitted from a host computer.

The sheet output from the laser printer 1 is directed into one of two routes by a sheet path selector 10. When a white/black image is required, the sheet is directed to a monochromatic discharge tray 11 or an automatic document feeder (hereinafter referred to as ADF) tray 12. When a color image is required, the sheet is directed first to the ADF tray 12 and then fed into the color image recording apparatus 20.

Sheets directed to the ADF tray 12 in this manner are then supplied, one by one, into the color image recording apparatus 20 by an ADF roller 13. A set of three such sheets, which have been output from the laser printer 1 and have monochromatic prints thereon constitute a set of mask members 15 (15R, 15G and 15B) for subsequent use in the color image recording apparatus 20. Each of the mask members 15 thus output normally has a curl toward the side on which the image is formed. Correction of this curl will be addressed during the description of the color image recording apparatus 20.

The color image recording apparatus 20 has a positioning unit 31 disposed at a lower location in the body. A mask member transport path 21 extends from the ADF tray 12 to the positioning unit 31. Roller pairs 22, 23, 24, 25, 26 and 27, gates 28 and 29 for changing the mask member route, and a mask member accommodating section 102 are provided on the left and right sides, as shown in FIG. 1, of the positioning unit 31.

A recurler roller pair 101 for removing a curl of a mask member 15 output from the laser printer 1 is disposed intermediate of the mask member transport path 21.

A mask member discharge tray 30 for receiving a mask member 15 after use and discharge from the recording apparatus 20 is provided on the outer side of the roller pairs 26 and 27.

The positioning unit 31 includes a sensor (not shown) for aligning the mask member 15, the roller pairs 32 and 33 disposed adjacent left and right end portions of the positioning unit 31, and a glass plate 34 disposed between the roller pairs 32 and 33.

A dedicated table 90 is installed below the body of the color image recording apparatus 20, and the color image recording apparatus 20 is carried on and integrated with the dedicated table 90. A first exposure device 41 is disposed below the positioning unit 31 such that it is movable in leftward and rightward directions along the lower surface of positioning unit 31. First exposure device 41 comprises a linear white light source (hereinafter referred to only as lamp) 42, a reflecting member 43 for reflecting light from the lamp 42, and a filter unit 44 including a red filter 44R, a green filter 44G and a blue filter 44B.

A photosensitive recording medium 50 is composed of a web serving as a base material with a photosetting resin material and microcapsules applied to the web. The photosetting resin material contains, as a main material, a photopolymerization initiator as is known, for example, by Japanese Patent Laid-Open No. 143044/1987, and is hardened by light of the wavelengths for red, green and blue. The microcapsules individually contain dye precursors of cyan, magenta or yellow. The photosensitive recording medium 50 is mounted in a cartridge 51 so that it is not exposed to light. The photosensitive recording medium 50 is drawn from the cartridge 51 and first passes between the glass plate 34 and an exposure table 52. It is wound around a takeup roller 54 after passing a buffer 55, a pressure developing unit 70, a separating roller 64 and a drive roller 57.

When an exposure operation is to be performed by the exposure device 41, exposure table 52 is moved down by a cam 53 so that a mask member 15 which has been transported onto the glass plate 34 by the roller pair 32, is closely contacted with the photosensitive recording medium 50. Meanwhile, a fastening roller 56 is located adjacent a left end of the exposure table 52 so that, when the exposure table 52 is moved down to a predetermined position, the fastening roller 56 is pressed against a left end portion of the exposure table 52. As a result, while an exposure operation is taking place using one of the mask members 15R, 15G or 15B, the photosensitive recording medium 50 is held between and fixed by the exposure table 52 and fastening roller 56.

Color developer sheets 60, comprised of sheets having a color developer as disclosed, for example, in Japanese Patent Laid-Open No. 88739/1983, are set in the cassette 61 such that the face to which the color developer is applied is directed downwardly. The color developer sheets 60 are supplied to the pressure developing unit 70 one by one from the cassette 61 by a suction cup 62 which is intermittently driven by a driving source (not shown). The color developer sheet 60 is pressed by a pair of pressure rollers 71 of the pressure developing unit 70 while it is held in an overlapping relationship with the photosensitive recording medium 50 that has been exposed to light. Consequently, the latent image formed on the photosensitive recording medium 50 by the exposure operation is changed into a visible image on the color developer sheet 60.

Comprising thermal fixing unit 80 are a casing 83 having a heater 81 and a vane wheel 82 located therein at upper locations, rubber rollers 84, 85 and 86 for the transportation of a color developer sheet 60 at a lower location, and an endless belt 89 extending between a pair of rollers 87 and 88.

The color developer sheet 60 fed from the pressure developing unit 70, and separated from the photosensitive recording medium 50 by the separating roller 64, is then glazed by the thermal fixing unit 80 and discharged to discharge tray 63.

Figure 2:
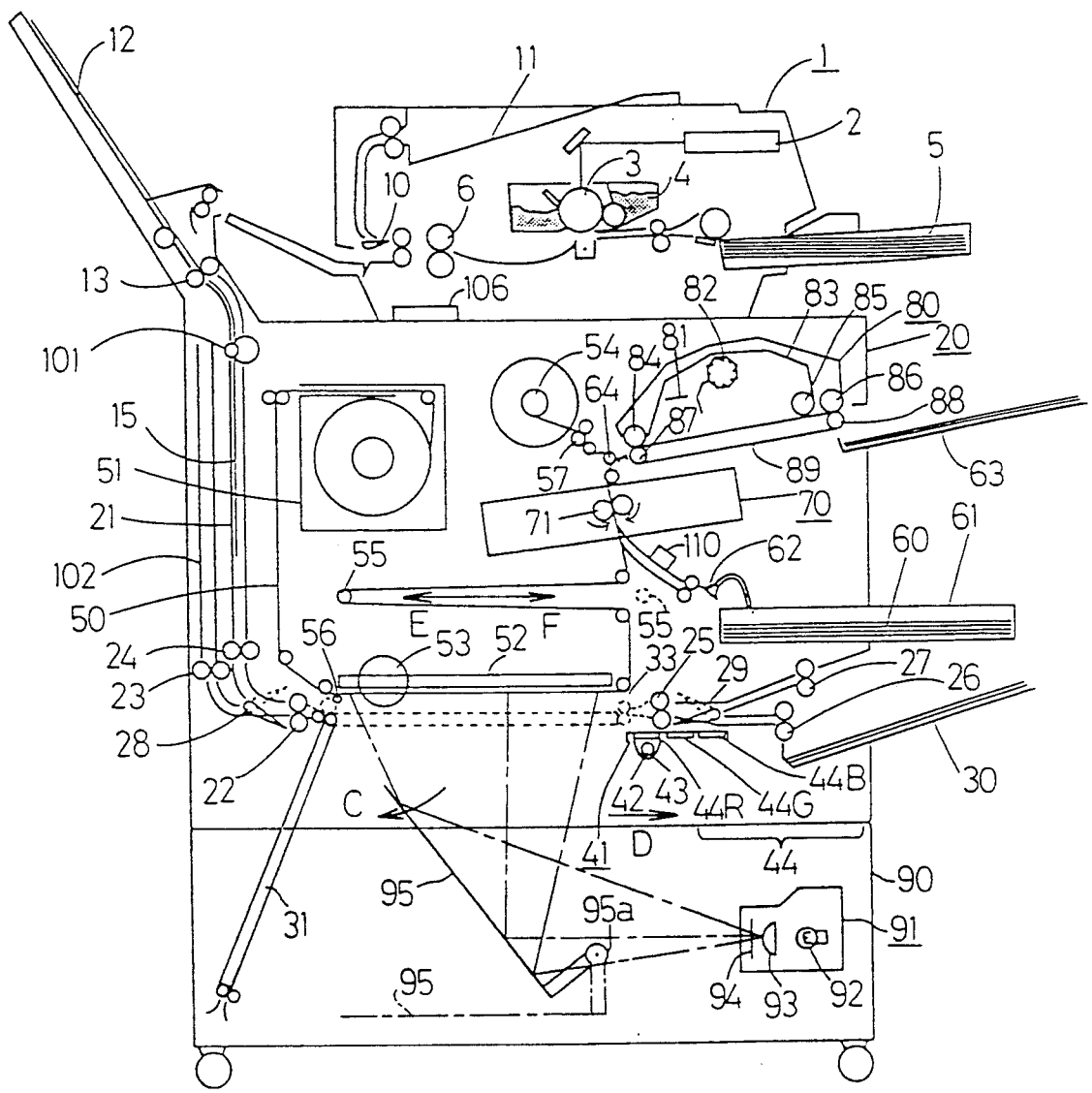
FIG. 2 shows the image recording apparatus in which a secondary exposure unit is used.
Figure 3:
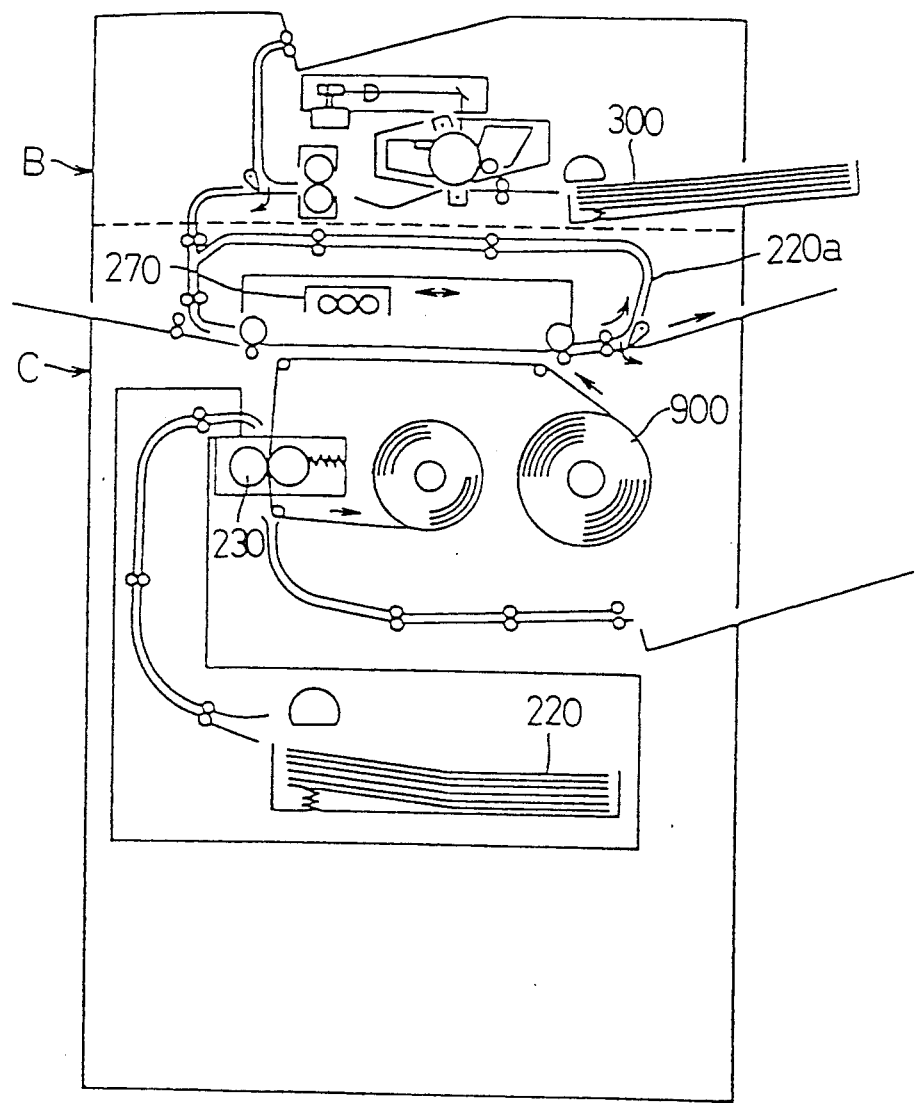
FIG. 3 shows an image recording apparatus according to the prior art.

The structure of the image recording apparatus 20, where enlarging exposure of a slide film, negative or similar transparency is performed, is described with reference to FIG. 2.

The positioning unit 31 is retracted in the direction indicated by arrow C while the first exposure device 41 is retracted in the direction indicated by arrow D.

A second exposure device 91, such as a slide projector, comprising a lamp 92, a lens 93, and a slide film 94 is installed inside of the dedicated table 90 in a manner that permits its removal. In addition, a reflecting mirror 95 is mounted in the dedicated table 90 so as to be capable of pivotal motion around a shaft 95a. Reflecting mirror 95 is normally positioned at the position indicated by the alternate long and short dash line. When the second exposure device 91 is to be used, the reflecting mirror 95 is pivoted to a second position, indicated by the solid line, after the positioning unit 31 has been retracted. Light emitted from the lamp 92 is then irradiated onto the photosensitive recording medium 50 by way of the lens 93, slide film 94 and reflecting mirror 95.

Operation of the image forming apparatus having the described structure for producing a plurality of color outputs from a set of mask members 15 will now be described.

First, a mask member 15R for red is produced by the monochromatic laser printer 1. The mask member 15R is a mask member which has toner at those points where all microcapsules containing dye precursors of yellow, cyan or magenta, are to remain unexposed or uncured and has clear areas to pass red light for curing or hardening the cyan microcapsules of the photosensitive recording medium 50. Subsequent actions to be described, using mask members 15G and 15B with filters for providing green and blue light through the clear portions of the mask member will cure or harden the magenta and yellow microcapsules respectively. In this instance, the mask member 15R output from the monochromatic laser printer 1 is sent to the ADF tray 12 and from there supplied to the color image forming apparatus 20 by the ADF roller 13.

Mask member 15R, fed into the color image recording apparatus 20, follows the mask member transport path 21 and is fed into the positioning unit 31 by the roller pairs 24 and 22. In this instance, the gate 28 is at the position indicated by solid lines. During such transport, the curled condition of the mask member 15R is corrected by the recurler roller 101.

Then, the positioning unit 31 transports the mask member 15R to the predetermined exposure position by the roller pair 32. Mask member 15R is accurately positioned by means of a driving source (not shown) using a positioning mark printed on the mask member 15R that is read by means of a sensor (not shown).

It is to be noted that immediately before such positioning is performed, the exposure table 52 is moved down to the predetermined position by the cam 53 until the left end portion thereof is contacted with the fastening roller 56 so that the photosensitive recording medium 50 is fixed to the exposure table 52. After completion of such positioning, the exposure table 52 is further moved down by cam 53 until it is in contact with the glass plate 34 of the positioning unit 31. In this position, the mask member 15R and the photosensitive recording medium 50 are in close contact with one another.

After the exposure table 52 is brought into close contact with the positioning unit 31, the lamp 42 is lit, with filter 44R in position over it, so that red light passes through the mask member 15R and irradiates the photosensitive recording medium 50. Since the first exposure device 41 performs a scanning exposure in the direction indicated by arrow A, the entire photosensitive recording medium 50 on the exposure table 52 is exposed to the light. After completion of the exposure, the lamp 42 is extinguished, and the first exposure device 41 is returned to its initial position in the direction indicated by arrow B. At this time, the filter unit 44 is rotated by a driving source (not shown) so that the green filter 44G is positioned above the lamp 42.

While the exposure device 41 is being returned to its initial position, the exposure table 52 is moved up by rotation of the cam 53 to space the photosensitive recording medium 50 away from the positioning unit 31 and mask member 15R.

Back tension is normally applied to the photosensitive recording medium 50, by means of a spring biased frictional coupling between the shaft supporting the photosensitive recording medium 50 and a part of the apparatus frame (not shown), from the center of rotation of the roll of the photosensitive recording medium 50 located in the cartridge 51. Accordingly, when the exposure table 52 is moved down, the photosensitive recording medium 50 is drawn from within the cartridge 51 by a length corresponding to the distance of downward movement of the exposure table 52, but when the exposure operation is completed and the exposure table 52 is moved up, the photosensitive recording medium 50 is rewound in a direction to take up any resulting slack.

After completion of the exposure by the mask member 15R for red, the exposure table 52 is moved up to the predetermined position by the cam 53. In this instance, since the fastening roller 56 remains in contact with the left end portion of the exposure table 52, the photosensitive recording medium 50 remains fixed with respect to the exposure table 52.

Subsequently, mask member 15G for green is produced by the monochromatic laser printer 1, and when the mask member 15G reaches a position directly forward of the roller pair 24 and past the ADF tray 12, ADF roller 13, recurler roller 101 and mask member transport path 21, the roller pairs 22, 24, 25 and 27 and the roller pairs 32 and 33 of the positioning unit 31 are rotated to transport the mask member 15R in the rightward direction to remove the mask member 15R from the positioning unit 31. Simultaneously, the mask member 15G is transported to and stopped at the exposure position. In this instance, the gates 28 and 29 are at the positions indicated by solid lines. Thus, the mask member 15R, after exposure, is clamped between the roller pair 27, and, after a trailing end of the mask member 15R passes the gate 29, rotation of the roller pair 27 is stopped. Consequently, the mask member 15R thereafter remains held by the roller pair 27.

The mask member 15G, introduced into the positioning unit 31, is positioned relative to the photosensitive recording medium 50 in the same manner as described for mask member 15R. Exposure table 52 is moved down to bring the mask member 15G into close contact with the glass plate 34 and the photosensitive recording medium 50. The lamp 42 is then lit to effect an exposure operation with green light by way of the green filter 44G. After completion of the exposure operation, the exposure table 52 is moved up to the predetermined position. The first exposure device 41 is moved back to its initial position while the filter unit 44 is moved to position the blue filter 44B above the lamp 42.

Subsequently, a further mask member 15B for blue produced by the monochromatic laser printer 1 is fed into the color image recording apparatus 20 in the same manner as was the case for the mask members 15R and 15G. After the mask member 15B is transported to the position directly forward of the roller pair 24, the roller pairs 24, 22, 25 and 26 and the roller pairs 32 and 33 of the positioning unit 31 are rotated in a direction to transport the mask member 15G in the rightward direction.

Consequently, the mask member 15G is fed from the positioning unit 31 while simultaneously the mask member 15B is transported to and stopped at the exposure position. In this instance, the gate 28 is at the position indicated by solid lines while the gate 29 is at the position indicated by broken lines. The mask member 15G, after exposure, is clamped between the roller pair 26, and after a trailing end thereof passes the gate 29, rotation of the roller pair 26 is stopped and the mask member 15G remains in the thus clamped condition.

The mask member 15B introduced into the positioning unit 31 is subjected to a similar operation to effect close contact exposure of the photosensitive record medium 50 with blue light.

By the operations as described, a latent image of a desired color image is recorded on the photosensitive recording medium 50. Subsequently, the exposure table 52 is moved up to its initial position.

Thereupon, the fastening roller 56 and the left end portion of the exposure table 52 are spaced away from each other to release the photosensitive recording medium and the buffer 55 is moved in the direction indicated by arrow E. As a result of the movement of the buffer 55, an unexposed portion of the photosensitive recording medium 50 is moved to a position below the exposure table as photosensitive recording medium 50 is withdrawn from the cartridge 51.

The drive roller 57 is stopped when a leading end portion of the latent image on the photosensitive recording medium 50 comes to a position adjacent the pressure roller 71 of the pressure developing unit 70.

A color developer sheet 60 is fed from within the cassette 61 by the suction cup 62 in synchronization with the movement of the photosensitive recording medium 50. The color developer sheet 60 is stopped at a position at which a leading end thereof corresponds to the leading end of the latent image of the photosensitive recording medium 50.

Then, the pressure roller 71 of the pressure developing unit 70 is rotated in the direction indicated by the arrow by a known driving device (not shown) to press, under pressure, the color developer sheet 60 with that portion of the photosensitive recording medium 50 on which the latent image is formed.

Simultaneously, the exposure table 52 is moved down to the predetermined position until the left end thereof is in contact with the fastening roller 56 thereby fixing the photosensitive recording medium 50 to the exposure table 52.

The photosensitive recording medium 50 is then fed, under pressure and in contact with the color developer sheet 60 through developing unit 70. Consequently, those of the microcapsules on the photosensitive recording medium 50 which have not been hardened are ruptured by the pressure so that the color contained therein reacts with developer on the color developer sheet 60 and a color image corresponding to the latent image on the photosensitive recording medium 50 is developed on the color developer sheet 60.

As the pressure roller 71 of the pressure developing unit 70 is rotated further in the direction indicated by the arrow, the buffer 55 moves in the direction indicated by arrow F.

When the leading end of the color developer sheet 60 comes to the separating roller 64, the color developer sheet 60 is peeled away from the photosensitive recording medium 50 and guided toward the thermal fixing unit 80.

In the thermal fixing unit 80, the color developer sheet 60 is heated by air which is heated by the heater 81 and circulated in the casing 83 by the vane wheel 82, thereby promoting color development of the color image of the color developer sheet 60. Simultaneously, a binder polymer (binding resin), for fixing the color developing medium to base paper of the color developer sheet 60, is melted by heat, and consequently, the surface of the color developer sheet 60 becomes smooth and produces a suitable degree of gloss.

The color developer sheet 60, after completion of the color developing and glossing processing, is then discharged into the discharge tray 63.

During the series of operations including initial pressurized developing, promotion of color development and glossing as described above, the photosensitive recording medium 50 remains held between and fixed by the exposure table 52 and fastening roller 56. Consequently, while the developing processing for a picture is proceeding, exposure processing of a latent image for another color image can be performed on the exposure table 52.

When exposure for a second color image is to be performed using the previously used mask members 15, the mask member 15B at the exposure position is fed out in the leftward direction while the mask member 15R held at the position of the roller pair 27 is fed back into the positioning unit 31. Accordingly, the roller pairs 24, 22, 25 and 27 and the roller pairs 32 and 33 of the positioning unit 31 are controlled to rotate to transport the mask member 15R in the leftward direction. In this instance, the gates 28 and 29 are at the positions indicated by solid lines in FIG. 1. The mask member 15B is held between the roller pair 24 and passes the gate 28, and when at a position at which a trailing end of mask member 15B has passed the gate 28, rotation of the roller pair 24 is stopped. Consequently, the mask member 15B is retained at that position by roller pair 24. Mask member 15R, fed into the positioning unit 31, is then positioned as described above, and the photosensitive recording medium 50 is exposed to red light when in close contact with the mask member 15R. Subsequently, the mask member 15R is fed out in the leftward direction from the exposure position while the mask member 15G, held by the roller pair 26, is fed into the positioning unit 31. In particular, the roller pairs 23, 22, 25 and 26 and the roller pairs 32 and 33 of the positioning unit 31 are rotated to transport the mask members 15R and 15G in the leftward direction. In this instance, the gates 28 and 29 are positioned at the positions indicated by broken lines. The mask member 15R is clamped between the roller pair 23, after a trailing end of mask member 15R passes the gate 28 rotation of the roller pair 23 is stopped and the mask member 15R is retained at that position. Mask member 15G, fed into the positioning unit 31, is positioned and then photosensitive recording medium 50 is exposed to green light while in close contact with the mask member 15G. Subsequently, the mask member 15G is fed out in the rightward direction from the exposure position, and then a similar operation is performed to feed the mask member 15B held at the position of the roller pair 24 into the positioning unit 31 in place of the mask member 15G and the photosensitive recording medium 50 is exposed to blue light while in close contact with mask member 15B. As a result, the latent image of the color image is formed on the photosensitive recording medium 50 and the color image is subsequently formed on a color developer sheet 60 as described above. By repeating a similar sequence of operations, a desired number of color images can be produced from a single set of mask members.

After the required number of color images have been produced from the same mask members 15, the mask members 15 are discharged into the discharge tray 30 from the roller pair 27 or roller pair 26.

On the other hand, in the case where a second set of mask members 15 are output from the monochromatic laser printer 1 while exposure processing of a series of color images from the first set of mask members 15 is proceeding, the second set of mask members are stored in the ADR tray 12. Then, the stored mask members 15 are subsequently fed one by one into the color image recording apparatus 20 by the ADF roller 13 after completion of an exposure operation for the preceding set of mask members.

Further, in the case of a set of mask members 15 produced from another monochromatic laser printer or a set of mask members 15 which have been used previously and are to be used again, manual insertion of the mask member 15 into the ADF tray 12 is possible.

Operation of the second exposure device 91, such as a slide projector, as an exposure device will now be described.

If the exposure mode using the second exposure device 91 is selected from an input device (not shown), the positioning unit 31 is pivoted in the direction of the arrow C by driving means (not shown) while the first exposure device 41 is moved in the direction of the arrow D by another driving means (not shown). Pivoting the positioning unit 31 out of the light path between the second exposure device 91 and the exposure 52 produces a clearer, sharper image copy on the photosensitive recording medium 50. Simultaneously, the reflecting mirror 95 is pivoted to the position indicated by solid lines. After a slide film 94 is set in position in the second exposure device 91, light from the lamp 92 passes through the lens 93 and slide film 94 whereupon the image of the slide film 94 is expanded by the lens 93. The light is reflected by the reflecting mirror 95 and irradiated upon the photosensitive recording medium 50 to form a latent image on the photosensitive recording medium 50. The color image is formed on a color developer sheet 60 by the pressure developing unit 70 and thermal fixing unit 80 in a manner generally as described above.

As apparent from the foregoing detailed description, according to the present invention, an image can be recorded on a photosensitive recording medium using a mask member and it is also possible to effect enlarging recording of an image which is formed on a medium other than a mask member, such as a slide film.

It is to be noted that, although an image of a slide film is projected by way of the reflecting mirror in the embodiment described above, as an alternative the second exposure device can be provided at a location opposed to the photosensitive recording medium such that the image of a slide film may be projected directly onto the recording medium.

Further, the present invention can be put into practice in various forms without departing from the spirit and scope of the invention as set forth herein.

What is claimed is:

1. An image recording apparatus to record an image on a photosensitive recording medium by exposure of the photosensitive recording medium to light by way of a light transmitting member, said apparatus comprising:
   an exposure station;
   first transport means for sequentially transporting a set of mask members through said exposure station;
   second transport means for transporting said photosensitive recording medium through said exposure station;
   a first exposure unit for irradiating light upon said photosensitive recording medium by way of said set of mask members at said exposure station to record an image formed on each said mask member on said photosensitive recording medium;
   a second exposure unit for irradiating light on said photosensitive recording medium by way of an auxiliary member having a light passing image thereon to project said light passing image to said photosensitive recording medium at said exposure station to record said light passing image on said photosensitive recording medium; and
   a reflecting member provided between said second exposure unit and said exposure station for reflecting light emitted from said second exposure unit to said photosensitive recording medium, wherein said reflecting member moves between an operating position to reflect said emitted light and a retracted position away from said operation position, and said exposure station includes a movable glass plate to support said mask member, said glass plate moving away from a light path from said second exposure unit to said photosensitive recording medium when said second exposure unit is in use.

2. An image recording apparatus as claimed in claim 1, wherein said second exposure unit is detachably provided in said apparatus.

3. An image recording apparatus as claimed in claim 1, wherein said auxiliary member is a slide film, and wherein said second exposure unit is a projector.

4. An image recording apparatus as claimed in claim 1, further comprising means for selecting between said first exposure unit and said second exposure unit.

5. An image recording apparatus for reproducing color images by passing light through members having light transmitting portions to a photosensitive recording member, the apparatus comprising:
   an exposure station;
   a first exposure unit for use with a set of mask members comprising a glass mask member support plate, a first light source, and a set of filters;
   a first transport means for sequentially feeding said set of mask members to said exposure station and storing each mask member of said set of mask members when not at said exposure station;
   a second exposure unit for use with a light transmitting member comprising a second light source and a holder for said light transmitting member;
   a second transport means for moving the photosensitive recording member through said exposure station; and
   a selection means for selecting between said first and said second exposure unit, wherein said second exposure comprises a reflecting member disposed between the light transmitting member and said exposure station, said reflecting member being pivotally mounted such that when said second exposure unit is in use, said reflecting member is in an operating position between the light transmitting member and said exposure station and when said first exposure station is in use, said reflecting member is in a retracted position, and said glass mask member support plate is movable away from said exposure station and said first light source and said set of filters are displaced to a side of said exposure station when said second exposure unit is selected using said selection means.

6. The image recording apparatus as claimed in claim 5, wherein said second exposure unit is detachably provided in said apparatus.

* * * * *